United States Patent [19]

Coucoulas

[11] 3,960,674
[45] June 1, 1976

[54] METHOD OF DEPOSITING A METAL ON A SURFACE COMPRISING AN ELECTRICALLY NON-CONDUCTIVE FERRITE

[75] Inventor: Alexander Coucoulas, Bridgewater Township, Somerset County, N.J.

[73] Assignee: Western Electric Company, Inc., New York, N.Y.

[22] Filed: Dec. 20, 1974

[21] Appl. No.: 534,920

[52] U.S. Cl. ................................ 204/16; 204/15
[51] Int. Cl.² .......................................... C25D 5/02
[58] Field of Search .............. 204/3, 4, 281, 20, 30, 204/16, 15

[56] References Cited
UNITED STATES PATENTS

| | | | |
|---|---|---|---|
| 1,275,687 | 8/1918 | Hodgson | 204/16 |
| 1,858,125 | 5/1932 | Von Devecis | 204/212 |
| 2,285,553 | 6/1942 | Arlt | 204/23 |
| 3,325,379 | 6/1967 | Bussolini et al. | 204/12 |
| 3,520,782 | 7/1970 | Carbonel | 204/16 |
| 3,639,215 | 2/1972 | Van Sciver et al. | 204/16 |
| 3,729,388 | 4/1973 | De Angelo et al. | 204/3 |
| 3,737,583 | 6/1973 | Katsutoshi | 204/16 |
| 3,808,106 | 4/1974 | Gerkema | 204/16 |
| 3,859,180 | 1/1975 | Hasty | 204/15 |

FOREIGN PATENTS OR APPLICATIONS

| | | |
|---|---|---|
| 843,625 | 7/1939 | France |
| 23,136 | 9/1882 | Germany |
| 39-20305 | 9/1964 | Japan |
| 208,134 | 8/1968 | U.S.S.R. |

OTHER PUBLICATIONS

Solid State Technology, Oct., 1974 pp. 49–53 and 72.
Bibliography in vol. 72, (1937) Trans. Electrochem. Soc., pp. 247–280.

Primary Examiner—T. M. Tufariello
Attorney, Agent, or Firm—J. Rosenstock

[57] ABSTRACT

A method of depositing a metal on a surface comprising an electrically non-conductive ferrite is disclosed. The method comprises contacting the surface with a cathodically charged element. The element is then electroplated to deposit a metal thereon and on the contacted surface.

19 Claims, 9 Drawing Figures

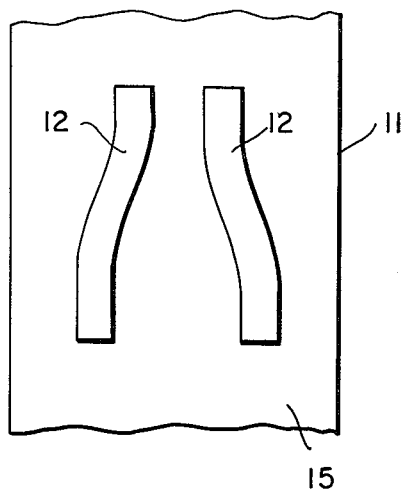
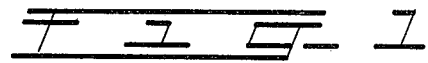
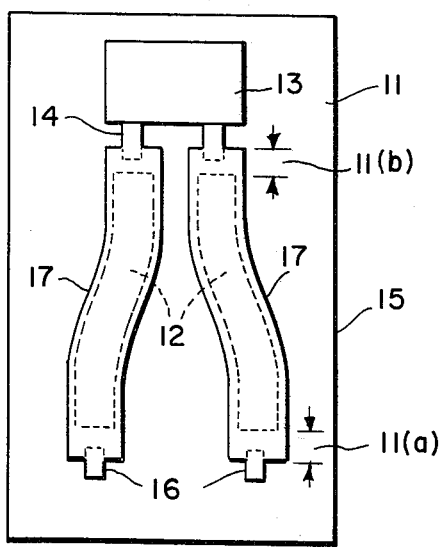
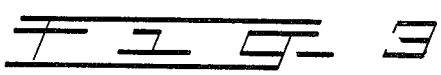
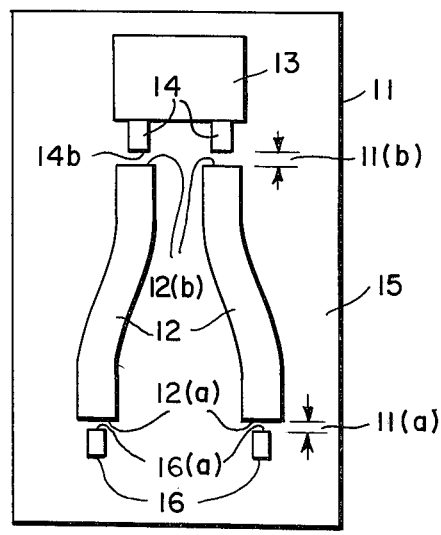
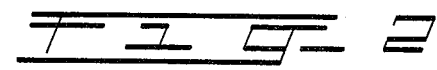

METHOD OF DEPOSITING A METAL ON A SURFACE COMPRISING AN ELECTRICALLY NON-CONDUCTIVE FERRITE

BACKGROUND OF THE INVENTION

1. Field of the Invention

This invention relates to a method of depositing a metal on a surface comprising an electrically non-conductive ferrite and more particularly, to a method of electrochemically depositing a metal on the surface to join at least two conductors placed thereon.

2. Description of the Prior Art

In the electroplating and electroforming art, an electrically conductive member or mandrel is employed. The use of electrically non-conductive members or mandrels is often desirable when one wants to utilize other properties of these materials. Non-conductive ferrites, for example, possess magnetic properties useful for holding and transporting articles.

High-temperature joining operations such as welding, soldering and brazing introduce stresses due to shrinkage and distortion of the joined material. In addition, such operations create material degradation due to recrystallization and grain growth in the materials which make up the joint. A low-temperature method of joining or interconnecting discrete parts is therefore desirable.

SUMMARY OF THE INVENTION

This invention relates to a method of depositing a metal on a surface comprising an electrically non-conductive ferrite and more particularly, to a method of electrochemically depositing a metal on the surface to join at least two electrical conductors placed thereon.

The method comprises contacting the surface with a cathodically charged element. The element is then electroplated to deposit a metal thereon and on the contacted surface.

BRIEF DESCRIPTION OF THE DRAWING

The present invention will be more readily understood by reference to the detailed description taken in conjunction with the drawing, wherein:

FIG. 1 is a plan view of electrically conductive elements on a carrier;

FIG. 2 is a plan view of the carrier of FIG. 1 having assembled thereon the conductive elements, a device having a lead extending therefrom adjacent one end of each element and a terminal adjacent the other end of each element;

FIG. 3 is a plan view of the assembly of FIG. 2 after electrodeposition;

DETAILED DESCRIPTION

Figure 4:
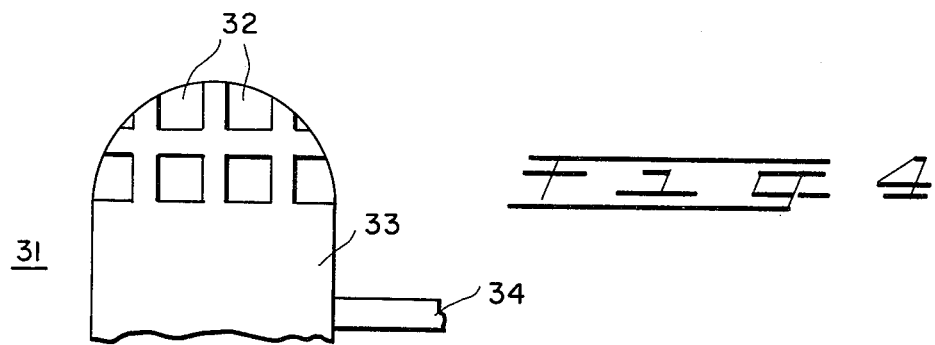
FIG. 4 is a cross-sectional view of a mandrel comprising an electrically non-conductive ferrite.

The present invention has been described primarily in terms of joining or connecting the leads of an electrical device such as an integrated circuit to conductive terminals. Such description is exemplary only; it will be readily appreciated that the inventive concept described is equally applicable to connecting or joining any two or more electrically conductive members which are in actual contact with or spaced apart from one another. In this regard, the members to be joined may comprise discrete parts of any apparatus, a printed circuit, or a device such as an integrated circuit.

Referring to FIG. 1, a suitable carrier 11 is selected. A suitable carrier is one comprising an electrically non-conductive ferrite. An electrically non-conductive ferrite is one having a resistivity of at least $10^4$ ohm-cm. Preferred ferrites comprise $Ba(Fe_2O_3)$ and $Sr(Fe_2O_3)$. Electrically conductive elements 12, e.g., copper elements, are placed on carrier 11. Referring to FIG. 2, an integrated circuit device comprising a chip or die 13 provided with leads 14 extending from at least one side thereof are placed on carrier 11. Integrated circuit chip 13 can be of a conventional type formed utilizing planar technology in which chip 13 comprises a semiconductor material such as silicon. The integrated circuit is typically formed by diffusing impurities into the silicon to form regions of opposite conductivity type with junctions therebetween extending to the planar active surface of the silicon chip. Conductive leads 14 which extend from integrated circuit chip 13 make contact with active regions (not illustrated) of the integrated circuit 13. Conductive leads 14 extend to or beyond the outer perimeter of die 13. It is to be noted that conductive leads 14 extending from chip 13 may be of any shape or configuration, including a conductive bump. Also placed on carrier 11 are terminal pins 16 comprising any suitable conductive material, e.g., copper. Conductive elements 12, circuit chip 13 and terminal pins 16 are placed on carrier 11 in a desired spatial relationship whereby (1) one edge 16(a) of each terminal pin 16 is either adjoining one end 12(a) of the corresponding element 12 or is adjacent thereto and (2) one end 14(b) of each lead 14 is either adjoining the other end 12(b) of the corresponding element 12 or is adjacent thereto. For illustrative purposes only, edges 16(a) and ends 12(a) as well as ends 12(b) and 14(b) are shown in FIG. 2 as being in close proximity to one another but not touching. Elements 12, device or chip 13 and terminal pins 16 are placed on carrier 11 and held in place thereon by any suitable conventional means known in the art. Typically these discrete components may be adhesively held on the carrier 11 or they may be compliant or hard-tool bonded to the surface of carrier 11 by low temperatures bonds that can easily be separated.

At least one set of the components, that is at least terminal pins 16, or leads 14 or conductive elements 12, is cathodically charged, as by connection to the negative pole of a DC voltage source (not shown) and the resultant array or assembly is exposed or immersed in a conventional electroplating bath containing a suitable anode, e.g., a nickel anode, which is connected to the positive pole of the DC voltage source (not shown). A suitable current density is maintained in the bath whereby a metal is deposited on the cathodically charged components and the ferrite surfaces 11(a) and 11(b) contiguous to the discrete conductive components, as illustrated in FIG. 3.

Continuous conductive metal patterns or paths 17 are formed which join or connect elements 12 to leads 14 and terminals 16. The electrodeposited metal is first deposited on the surface of the cathodically charged components, and then grows outward therefrom on the ferrite surface [at least 11(a) or 11(b)] of carrier 11. Of course, terminal pins 16, leads 14 and elements 12 can all be cathodically charged during the formation of metal pattern 17.

Surprisingly and unexpectedly, when a surface comprises a non-conductive ferrite, such as $Ba(Fe_2O_3)$ or $Sr(Fe_2O_3)$, there is an electrodeposition on a cathodically charged conductor in contact therewith which spreads and grows onto the ferrite surface and which soon can cover the entire ferrite surface if allowed to do so. This is an as yet unexplained phenomenon exhibited by electrically non-conductive ferrite containing materials.

The described electrodeposition process forms an electroplated, electrically interconnected assembly. The electroplated assembly may then be treated with a suitable encapsulant in a conventional manner well known to those skilled in the art to form a package or integrated circuit assembly having an insulative body (not shown) and at least one partially unencapsulated or exposed interconnected terminal pin. Some typical suitable encapsulants comprise conventional epoxy resins, acrylic resins, phenolics, etc., which are well known to those skilled in the art.

The partially encapsulated assembly may then be removed from carrier 11 using any conventional means. Upon removal from carrier 11, the partially encapsulated assembly is further treated with the encapsulant whereby the assembly surface which had been in contact with the carrier surfaces is coated or covered. An integrated circuit package is thus formed having an insulative body with interconnected terminal pins, at least a portion of which are unencapsulated, extending therefrom.

Figure 5:
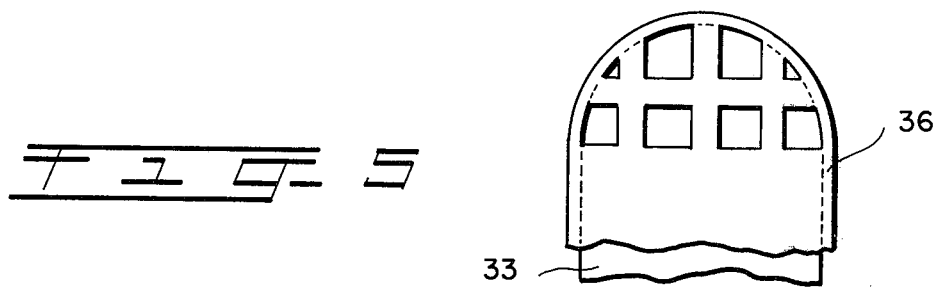
FIG. 5 is a cross-sectional view of the mandrel of FIG. 4 which has been subjected to an electrolytic metal deposition.

In another embodiment of the present invention, intricate metallic patterns or articles may be electroformed employing mandrels comprising a suitable non-conductive ferrite such as $Ba(Fe_2O_3)$ or $Sr(Fe_2O_3)$. With reference to FIG. 4, there is shown a suitable base member or mandrel 31 having a masked area 32 and an unmasked area 33. Area 32 may be formed by conventional photoresist masking techniques or by other masking techniques well known in the art. An external conductive element 34 is placed in contact with unmasked surface area 33 of mandrel 31. Element 34 is cathodically charged as by connection to the negative pole of a DC voltage source (not shown) and the resultant array is immersed in a conventional electroplating bath containing a suitable anode, e.g., a nickel anode, which is connected to the positive pole of the DC voltage source (not shown). A suitable current density is maintained in the bath wherein a metal is deposited on unmasked surface 33 of mandrel 31 to form the desired metallic pattern or article 36 as shown in FIG. 5.

The resultant metallic article 36 may be removed from the mandrel 31 using any conventional means.

EXAMPLE I

A ferrite carrier comprising $Ba(Fe_2O_3)$, having a resistivity of about $10^4$ ohm-cm, was employed. The carrier was magnetized and a 0.002 inch steel shimstock was magnetically attached thereto. The resultant carrier and shimstock were then immersed in a commercially obtained nickel electroplating bath comprising a nickel sulfamate $[Ni(NH_2SO_3)_2]$ and the shimstock was cathodically charged. At an initial current density of 17 ma/cm$^2$, a 0.5 mil thick metallic nickel deposit was deposited on the cathodically charged shimstock and then laterally grown from the shimstock onto the ferrite carrier after about 5 minutes.

EXAMPLE II

The procedure of Example I was repeated except a 0.002 inch steel shimstock was employed having a rectangular aperture therethrough. A 16 beam-lead silicon integrated circuit device was placed in contact with the carrier within the aperture. The leads of the device were adjoining the walls of the aperture but out of contact therewith. A 0.5 mil thick metallic nickel deposit was deposited on the shimstock and then laterally grown from the shimstock on the ferrite surface and onto the beam leads of the device after about 20 minutes.

EXAMPLE III

Figure 6:
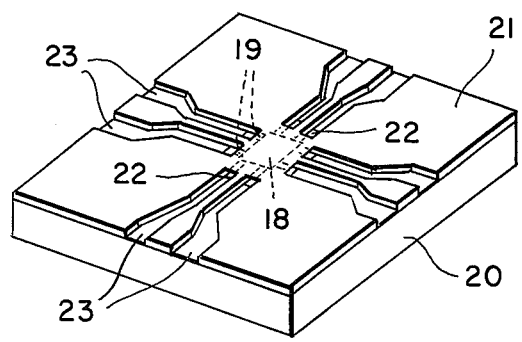
FIG. 6 is an isometric view of an integrated circuit on a ferrite carrier which has an exposed and developed photoresist coating thereon.

Referring to FIG. 6, an integrated circuit device 18 having 16 beam leads 19 extending therefrom (for clarity only eight leads are shown) was fabricated with a permalloy magnetic deposit on its back surface or inactive surface. Device 18 was then placed on a ferrite carrier 20 comprising $Ba(Fe_2O_3)$. The ferrite had been magnetized to hold the device in place.

Figure 7:
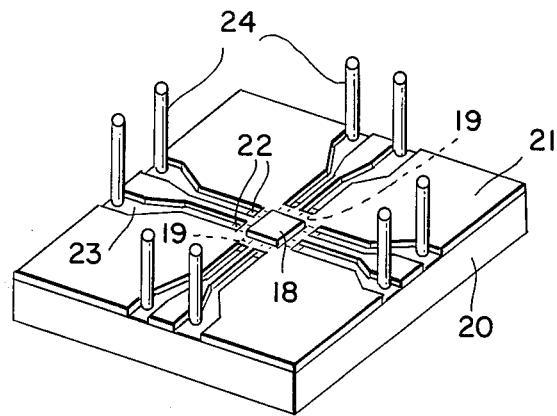
FIG. 7 is an isometric view of the integrated circuit of FIG. 6 which has conductive external elements in contact with exposed portions of the carrier.

A conventional positive photoresist comprising a creosote-formaldehyde resin, commercially obtained, was sprayed over device 18 and the surrounding ferrite surface. The photoresist was selectively exposed through a polyethyleneterephthalate mask to a conventional source of ultraviolet radiation for 12 minutes and then developed with a commercially obtained developer comprising an aqueous mixture of NaOH and methyl ethyl ketone. The unexposed photoresist areas were removed to delineate (1) a photoresist protective coating 21 on the circuit chip and on areas of the carrier, (2) an unprotected portion 22 of each beam lead 19 and (3) an unprotected pattern 23 on the surface of the carrier 20 which extended from and joined the unprotected portion 22 of each beam lead 19. Sixteen copper pins 24 were then each positioned approximately perpendicular to the ferrite surface in contact with the surface of one of the radial arms of unprotected pattern 23, as shown in FIG. 7 (for clarity, only 8 copper pins and leads are shown). A conductive rubber sheet with a back-up plate (not shown) was used to force the pins 24 against the ferrite surface. The resultant assembly was then cleaned by immersion for one minute in a mild aqua regia solution (1 part by volume concentrated $NHO_3$ [70% by weight], 1 part by volume concentrated HCl [37% by weight], 12 parts by volume $H_2O$), and then in deionized water for 2 minutes. The assembly was then immersed in a commercially obtained electroplating bath comprising nickel sulfamate $[Ni(NH_2SO_3)_2]$, and containing a nickel anode. The pins 24 were then cathodically charged via the conductive rubber sheet which was not immersed.

Figure 8:
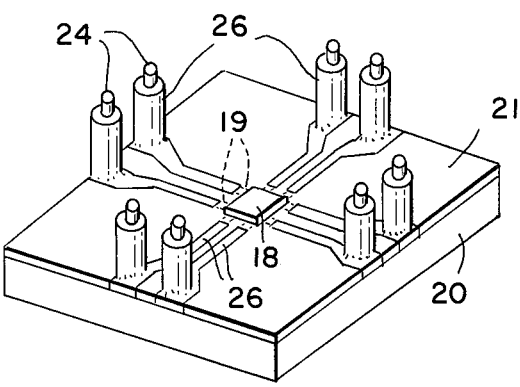
FIG. 8 is an isometric view of the integrated circuit of FIG. 7 which has been subjected to an electroplated metal deposit.
Figure 9:
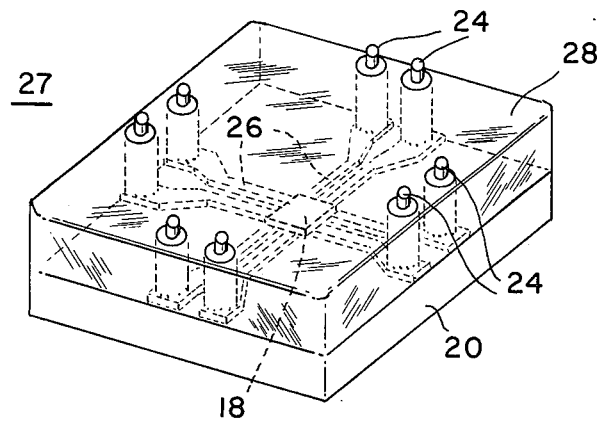
FIG. 9 is an isometric view of the integrated circuit of FIG. 8 which has had the photoresist coating stripped and which has been partially encapsulated.

At an initial current density of 17 ma/cm² metalic nickel was deposited on the cathodically charged copper pins 24 and then laterally grown from pins 24 onto ferrite carrier 20 along the photoresist delineated unexposed pattern 23 and on exposed portions 22 of beam leads 12 to form a continuous conductive path 26 as shown in FIG. 8. After an electroplated nickel deposit of about 0.5 mil in thickness, the plating was discontinued and the remaining photoresist was dissolved in acetone. A commercially obtained, rapidly self-setting resin was then molded (approximately 0.250 inch thick) on the ferrite surface, nickel plated structure, integrated circuit chip and a portion of the nickel plated copper pins to form after about 0.5 hours a cured, partially encapsulated assembly or package 27 as illustrated in FIG. 9. The partially encapsulated package was then lifted off the ferrite surface and the surface thereof which had been contacting the ferrite surface was treated with the resin to form a cured resin layer thereon of about 125 mils.

It is to be understood that the abovedescribed embodiments are simply illustrative of the principles of the invention. Various other modifications and changes may be made by those skilled in the art which will embody the principles of the invention and fall within the spirit and scope thereof.

What is claimed is:

1. A method of depositing a metal on an exposed surface comprising an electrically non-conductive ferrite, having a resistivity of at least $10^4$ ohm-cm, which comprises:
   directly contacting the exposed ferrite surface with a cathodically charged element, and
   electroplating said element to deposit a metal thereon and on an adjoining portion of said contacted exposed ferrite surface.

2. The method as defined in claim 1 wherein said surface comprises a ferrite selected from the group consisting of $Ba(Fe_2O_3)$ and $Sr(Fe_2O_3)$.

3. A method of preparing at least one discrete conductive form which comprises:
   a. selectively masking an exposed surface of a base comprising an electrically non-conductive ferrite, having a resistivity of at least $10^4$ ohm-cm, to delineate an unmasked pattern, on said exposed surface, conforming in shape to the conductive form;
   b. contacting said pattern with a cathodically charged element; and
   c. exposing said element and said contacted pattern to an electrolytic plating bath to deposit a metal on at least said pattern to produce the conductive form.

4. The method as defined in claim 3 wherein said base comprises a ferrite selected from the group consisting of $Ba(Fe_2O_3)$ and $Sr(Fe_2O_3)$.

5. The method as defined in claim 3 which further comprises removing the conductive form from said base surface.

6. A method of electroforming a metallic article, which comprises:
   a. preparing a mandrel, comprising an electrically non-conductive ferrite containing material, having a resistivity of at least $10^4$ ohm-cm, conforming in shape to the article;
   b. contacting an exposed surface of said mandrel with a cathodically charged element; and
   c. exposing said element and said contacted exposed mandrel surface to an electroplating solution to deposit a metal on at least said exposed mandrel surface to form the metallic article.

7. The method as defined in claim 6 wherein said mandrel comprises a ferrite selected from the group consisting of $Ba(Fe_2O_3)$ and $Sr(Fe_2O_3)$.

8. The method as defined in claim 6 which further comprises removing said formed metallic article from said mandrel surface.

9. A method of conductively joining at least two electrically conductive elements, which comprises:
   a. situating the elements adjacent to one another on an exposed area of a fixture comprising an electrically non-conductive ferrite having a resistivity of at least $10^4$ ohm-cm,
   b. cathodically charging at least one of said elements, and
   c. exposing said exposed fixture area having the elements thereon to an electroplating bath to deposit a metal on said charged element and on at least a portion of said exposed fixture area contiguous thereto to join the elements.

10. The method as defined in claim 9 wherein said fixture comprises a ferrite selected from the group consisting of $Ba(Fe_2O_3)$ or $Sr(Fe_2O_3)$.

11. A method of making an electrical connection to a lead of an integrated circuit device, which comprises:
    a. placing the integrated circuit having the lead extending therefrom on an exposed surface of a carrier comprising an electrically non-conductive ferrite having a resistivity of at least $10^4$ ohm-cm,
    b. placing a conductive lead on said exposed carrier surface adjacent to said integrated circuit lead,
    c. cathodically charging one of said leads, and
    d. immersing said exposed carrier surface having said charged lead thereon in an electroplating bath to deposit a metal on said charged lead and on an area of said exposed carrier surface contiguous thereto to form the electrical connection and an electroplated assembly.

12. The method as defined in claim 11 wherein said carrier comprises a ferrite selected from the group consisting of $Ba(Fe_2O_3)$ and $Sr(Fe_2O_3)$.

13. The method as defined in claim 11 which further comprises partially encapsulating said electroplated assembly with a suitable encapsulant to form an assembly having at least a portion of said conductive lead exposed.

14. The method as defined in claim 13 which further comprises removing said partially encapsulated assembly from said carrier surface.

15. The method as defined in claim 14 which further comprises:
    treating said removed assembly with said encapsulant to coat the carrier-contacted surface.

16. In an improved method of forming an integrated circuit package, which comprises:
    a. electrically interconnecting a portion of each lead of an integrated circuit, containing a plurality of leads, with a terminal pin to form an interconnected device;
    b. partially encapsulating the interconnected device in an electrically insulative material to form an insulative body having a plurality of terminal pins, extending therefrom, wherein the improvement comprises:
       in step (a), placing the integrated circuit and the plurality of terminal pins on a surface of a carrier, comprising an electrically non-conductive ferrite, having a resistivity of at least $10^4$ ohm-cm, in a desired spatial relationship whereby each terminal pin of the plurality of terminal pins is adjacent to each lead to which it is to be connected;

cathodically charging the terminals or the leads; and exposing said carrier surface to an electroplating solution to electroplate metal on the terminals, on the carrier contiguous thereto and on the leads to form the interconnected device.

17. The method as defined in claim 16 wherein said carrier comprises a ferrite selected from the group consisting of $Ba(Fe_2O_3)$ and $Sr(Fe_2O_3)$.

18. The method as defined in claim 16 which further comprises removing said insulative body from said surface.

19. The method as defined in claim 18 which further comprises:

treating said removed body with said encapsulant to coat the carrier-contacted surface.

* * * * *